United States Patent [19]
Chen

[11] Patent Number: 5,668,545
[45] Date of Patent: Sep. 16, 1997

[54] SIMPLIFIED ENCODING APPARATUS AND METHOD FOR PILOT TONE MODULATION IN AUTOMATIC-TRACK-FOLLOWING

[75] Inventor: Tian-Rein Chen, Taipei, Taiwan

[73] Assignee: Industrial Technology Research Institute, Taiwan

[21] Appl. No.: 494,821

[22] Filed: Jun. 26, 1995

[51] Int. Cl.$^6$ ................................................ H03M 7/00
[52] U.S. Cl. ................................................ 341/50
[58] Field of Search .......................... 341/50, 51, 55, 341/88

[56] References Cited

U.S. PATENT DOCUMENTS 3,903,401  9/1975  Jayant ........................... 235/151.3

*Primary Examiner*—Brian K. Young
*Attorney, Agent, or Firm*—Finnegan, Henderson, Farabow, Garrett & Dunner, L.L.P.

[57] ABSTRACT

A 24/25 modulation encoding device for generating a power spectrum of a binary sequence using spectrum peak and notch power monitoring (SPNPM) modulation is disclosed in this invention. The encoding device includes a dual polarity up-down counter for generating digitized step functions for replacing sine and cosine functions recruited by the SPNPM modulation. The encoding device further includes a bit shifter and an accumulator for generating an estimator of expectation for approximating a real and an imaginary part of a work value for obtaining a power spectrum required by the SPNPM modulation. The encoding device further includes an absolute accumulator for receiving said estimator of expectation approximating said real and imaginary parts of said work value for generating an absolute work value to replace a work-square value required for generating a power spectrum. The encoding device further includes a linear circuit with an input terminal designated as a DC terminal looping back for extra-weighting an input therefrom. The encoding device further includes a comparator coupled to said linear sum circuit for determining a smaller sum value for monitoring a notch required by the SPNPM modulation for reducing circuit complexity of the encoding device.

10 Claims, 8 Drawing Sheets

SIMPLIFIED ENCODING APPARATUS AND METHOD FOR PILOT TONE MODULATION IN AUTOMATIC-TRACK-FOLLOWING

BACKGROUND OF THE INVENTION

1. Field of the Invention

This invention relates generally to a method for encoding tracking tone modulation for application in magnetic recording. More particularly, this invention relates to an improved method and apparatus for encoding a 24/25 modulation code adopted by an international standard committee of consumer digital video cassette recorder (VCR) whereby faster encoding speed and lower integrated circuit (IC) gate count can be achieved to improve operational flexibility while achieving lower manufacture costs.

2. Description of the Prior Art

For the design and manufacture of modern digital video cassette recorders (VCRs), two of the most important design considerations for auto-track following (ATF) are the encoding speed and the hardware requirement. In a conventional system, high integrated circuit (IC) gate count is required in order to achieve high speed ATF encoding which is necessary to achieve higher level of performance. However, in order to achieve a second set of design goals of reducing production cost while increasing reliability, the gate count and the number of ICs should be kept as low as possible to simplify the hardware configuration. Therefore, when conventional encoding techniques are applied, these design goals impose conflicting gate count requirements. An encoding apparatus with simple design which is formed with low IC gate count while capable of providing high encoding speed is not available.

In 1993, under the sponsorship of Matsushita, Philips, Sony, and Thompson, a global conference was held which was participated by most of the major consumer electronic manufacturers. The purpose of that conference was to evaluate and determine a common standard for digital VCRs, particularly for VCRs manufactured for the consumer markets. A draft standard was produced based on a proposal initiated by Matsushita and Sony. The draft standard covers the current standards employed in television broadcasting such as NTSC, PAL, and also the standards to be employed in future high definition TVs. A 24/25 modulation code was adopted in this draft standard. This modulation code has high encoding efficiency. It has additional advantage in that the DC components are eliminated from the efficiency spectrum. Furthermore, at the frequency of either 1/90 Tb or 1/60 Tb (where Tb represents bit per transfer period), a peak or notch can be generated to serve as the pilot tracking tone. The space requirement for storing the auto-track following (ATF) signals can thus be reduced in performing the helical scan.

The technique of helical scan has long been applied to analog VCRs. Recently, helical scan has also been used in digital audio tapes, 8 mm data cartridges, and D1, D2, and D3 video recording systems. For magnetic recording, helical scan technique is recognized as the most efficient method; however, complicated mechanical structure and control techniques must be employed. The operation of the auto-tracking function (ATF) is the most difficult portion in controlling the recording system. In reading the data stored in the magnetic storage media, in addition to reading and restoring the original stored data on the storage media, a reference signal for auto-tracking must also be generated to assure that the magnetic heads are precisely tracking the recording media which are typically formed as magnetic strips. FIG. 1 shows the operation of such an ATF function. There are three recording strips on the storage media, i.e., F0, F1, and F2 tracks. Each of these strips contains data for generating track following power spectrum as shown in FIG. 2 wherein there are peaks and notches at specific frequencies, e.g., freq1 and freq2. Three magnetic heads, i.e., heads 1, 2, and 3 are also shown in FIG. 1 where the widths of these heads are slightly wider than the tracks. The magnetic head 2 is positioned over the mid-portion of the F0 track and extends over to F1 and F2 tracks. The power spectrum generated from the signals detected by head 2 is used to cancel out each other thus generating a calibration power difference of a value of zero between freq1 and freq2. While the power difference generated from signals detected by head 1 and head 0 is used to generate a calibration power difference which has either a positive or negative value respectively. Depending on the signs of the calibration power difference, the head is controlled and calibrated to generate a zero calibration power spectrum to maintain the head at a position right on top of the middle portion of strip F0 as shown for head 2. As the traditional modulation codes cannot be used to generate the power spectrum as shown in FIG. 2, a separate zone on a video tape must specifically be assigned for ATF purpose as shown in FIG. 3. The total usable areas for recording video data are reduced due to this requirement of separately assigned ATF zones. Furthermore, since only part of the magnetic recording media contains ATF data, more advanced track following features, such as dynamic head tracking cannot be performed.

The 24/25 modulation code which is adopted in the video cassette recorder (VCR) draft standard provides a highly efficient encoding method to overcome the above limitations. The magnetic strips used for recording video data can also be encoded to generate ATF signals. A global ATF feature is achievable while the recording space is expanded because a separate zone for ATF calibration, used in a traditional track following technique, is no longer required. FIG. 4 shows a word $\{D_k | k=0, 1, 2, \ldots\}$, includes three bytes, wherein every bit is defined as $\{d_{k,i} | i=23, 22, 21, \ldots 0\}$. The 24/25 modulation code is implemented by adding a bit $e_k$ for each word $D_k$. The modulated output code can be represented as $\{o_n = c_{k,i} | n = 25*k+24-i\}$ and $c_{k,i}$ is further defined as:

$$c_{k,i} = \begin{cases} e_k \oplus c_{k-1,i} & i = 24 \\ d_{k,23} \oplus c_{k-1,0} & i = 23 \\ d_{k,i} \oplus c_{k,i+2} & 0 \leq i \leq 22 \end{cases} \quad (1)$$

Equation (1) is generally referred to a an interleaved NRZI or abbreviated as INRZI. In the standard for 24/25 modulation encoding, certain specific rules of run length limit and power spectrum criterion are applied to determine whether $e_k$ is a bit of either zero or one.

In order to generate generate peaks and notches at freq1 and freq2, e.g., $f_p/60$ and $f_p/90$, a spectrum peak and notch power monitoring (SPNPM) scheme is employed in a conventional modulation encoder. The SPNPM scheme is based on the theory that a peak at freq1 and freq2 will be generated when the $e_k$ is selected such that the power spectrum $P_k$ is maximized where $P_k$ is defined as below:

$$S_k = S_{k-1} + \sum_{i=24}^{0} C_{k,i} e^{-j(25k+24-i)\Omega} \text{ where } \Omega = 2\pi f_p$$

$$w_k = S_k/25K \quad \text{where } K = 0, 1, 2, \ldots 836 \quad (2)$$
$$P_k = |w_k|^2$$

Based on the SPNPM scheme, a notch is generated at freq1 and freq2 by selecting $e_k$ to minimize $P_k$ as defined in Equation (2).

In Equation (2), the power spectrum $P_k$ has a real part $pr_k$ and an imaginary part $pi_k$ which can be calculated from the real part $sr_k$ and the imaginary part $si_k$ as the followings:

$$sr_k = sr_{k-1} + \sum_{i=24}^{0} C_{k,i} \cos(25k + 24 - i)\Omega \quad \text{and} \quad wr_k = sr_k/25k \quad (3\text{-}1)$$

$$si_k = si_{k-1} + \sum_{i=24}^{0} C_{k,i} \sin(25k + 24 - i)\Omega \quad \text{and} \quad wi_k = si_k/25k \quad (3\text{-}2)$$

$$p_k = pr_k + pi_k, \quad \text{where } pr_k = wr_k^2 \text{ and } pi_k = wi_k^2 \quad (4)$$

Based on the above equations, assuming that the added bit $e_k$ is determined to be e, the values of the power spectrum can be calculated as:

i) The DC component of the power spectrum, i.e., $dcp_{kle}$, can be calculated as $P_k$ in Equation (2) by substituting $e_k$ with e and setting fp=0.

ii) The power spectrum of the real components of a peak, i.e., $ppr_{kle}$, can be calculated as $pr_k$ in Equation (4) by substituting $e_k$ with e and setting fp=freq1 for track F1 and fp=freq2 for F2.

iii) The power spectrum of the imaginary components of a peak, i.e., $ppi_{kle}$, can be calculated as $pi_k$ in Equation (4) by substituting $e_k$ with e and setting fp=freq1 for track F1 and fp=freq2 for track F2.

iv) The power spectrum of the notch, i.e., $np_{kle}$, can be calculated as $p_k$ in Equation (2) by substituting $e_k$ with e and setting fp=freq1 for track F1 and fp=freq2 for track F2.

v) The power spectrum of notch, i.e., $np_{kl}{}^x{}_e$, at freqX, can be calculated as $p_k$ in Equation (2) by substituting $e_k$ with e and setting fp=freqx for track F0.

In order to carry out above computations by the use of logic circuits in an integrated circuit chip, a very complex circuit design has to be implemented requiring a very high gate count. In a modulation encoding apparatus to manage the SPNPM encoding computations, the complexity of the encoding apparatus is increased due to the facts that: a) sine and cosine functions are used, b) square and division calculations are involved, and c) five layers of logic decision making processes are performed. Thus, a highly complex IC apparatus with large gate count is necessary to perform the 24/25 modulation encoding for carrying out ATF functions.

Therefore, a need still exists in the art of automatic track following (ATF) by applying the 24/25 modulation encoding to provide a new and improved encoding apparatus with reduced gate count by implementing a simplified encoding scheme to overcome the difficulties in the prior art Specifically, the simplified encoding procedure must be able to reduce the complexity of the encoding processes caused by required computations of sine and cosine functions, the square and division operations, and the five layers of logic decisions required in the conventional SPNPM methods.

SUMMARY OF THE PRESENT INVENTION

It is therefore an object of the present invention to provide an encoding apparatus with reduced gate count by implementing a simplified encoding technique such that the aforementioned difficulties and limitations in the prior art can be overcome.

Specifically, it is an object of the present invention to provide an encoding apparatus which implements a simplified encoding technique such that the sine and cosine operations required to be performed by a conventional encoder are replaced with simplified integer operations.

Another object of the present invention is to provide an encoding apparatus which implements a simplified encoding technique such that the square operations required to be performed by a conventional encoder are replaced with simplified absolute value operations.

Another object of the present invention is to provide an encoding apparatus which implements a simplified encoding technique such that the division operations required to be performed by a conventional encoder are replaced with simplified estimation of expectation value operations.

Another object of the present invention is to provide an encoding apparatus which implements a simplified encoding technique such that the multiple layer of derision logic operations required to be performed by a conventional encoder are replaced with simplified minimum estimator sum strategy (MESS) operations.

Briefly, in a preferred embodiment, the present invention includes a 24/25 modulation encoding device for generating a power spectrum of a binary sequence using spectrum peak and notch power monitoring (SFNFM) modulation. The encoding device includes a dual polarity up-down counter for generating digitized step functions to replace sine and cosine functions required by the SPNPM modulation. The encoding device further includes a bit shifter and an accumulator for generating an estimator of expectation for approximating a real and an imaginary part of a work value for obtaining a power spectrum required by the SPNPM modulation. The encoding device further includes an absolute accumulator for receiving said estimator of expectation approximating said real and imaginary parts of said work value and for generating an absolute work value to replace a work-square value required for generating a power spectrum. The encoding device further includes a linear sum circuit with an input terminal designated as a DC terminal looping back for extra-weighting an input therefrom. The encoding device further includes a comparator coupled to said linear sum circuit for determining a smaller sum value for monitoring a notch required by the SPNPM modulation for reducing circuit complexity of the encoding device.

It is an advantage of the present invention that it provides an encoding apparatus which implements a simplified encoding technique such that the sine and cosine operations required to be performed by a conventional encoder are replaced with simplified integer operations.

Another advantage of the present invention is that it provides an encoding apparatus which implements a simplified encoding technique such that the square operations required to be performed by a conventional encoder are replaced with simplified absolute value operations.

Another advantage of the present invention is that it provides an encoding apparatus which implements a simplified encoding technique such that the division operations required to be performed by a conventional encoder are replaced with simplified estimation of expectation value operations.

Another advantage of the present invention is that it provides an encoding apparatus which implements a simplified encoding technique such that the multiple layer of decision logic operations required to be performed by a conventional encoder are replaced with simplified minimum estimator sum strategy (MESS) operations.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
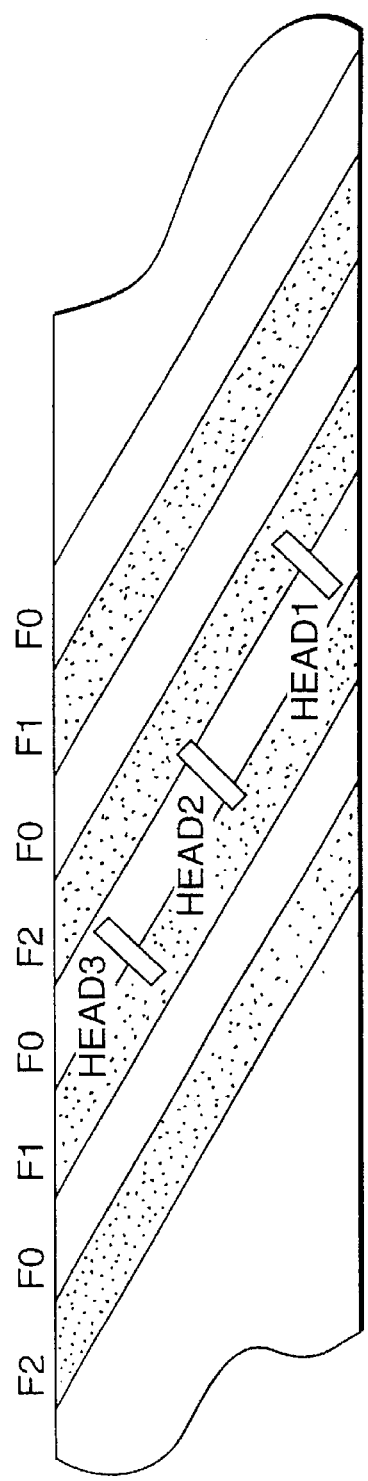
FIG. 1 is a perspective view showing different positions of the magnetic head relative to the recording strips for auto-track following (ATF)
Figure 3:
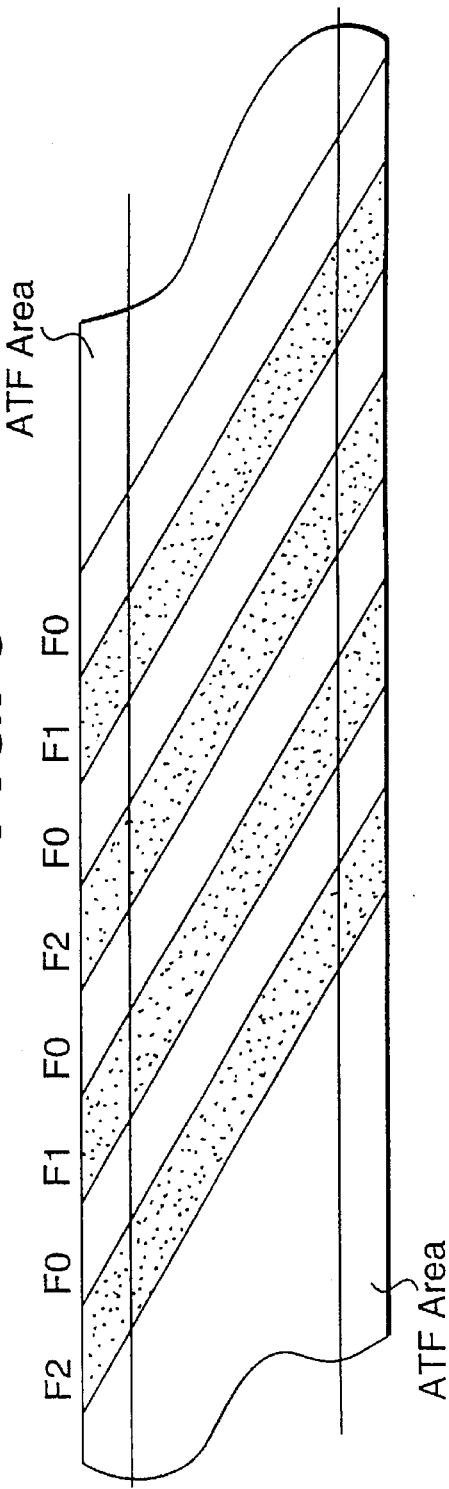
FIG. 3 is a perspective view showing a separate, ATF zone for the ATF strips employed in the conventional helical-scan technique.
Figure 2A:
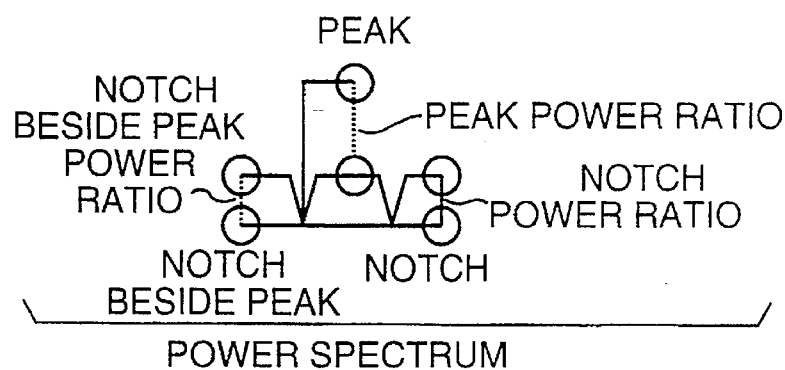
FIG. 2 shows the power spectrum standards for F0, F1, and F2 tracks of digital VCRs using 6.3 mm magnetic tape.
Figure 2B:
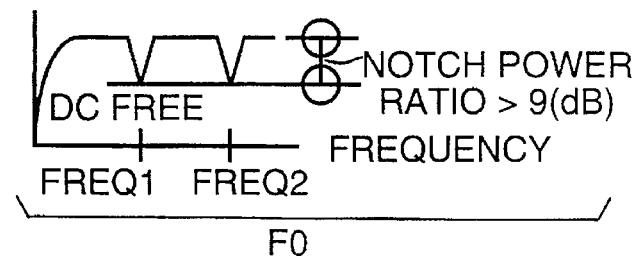
Figure 2C:
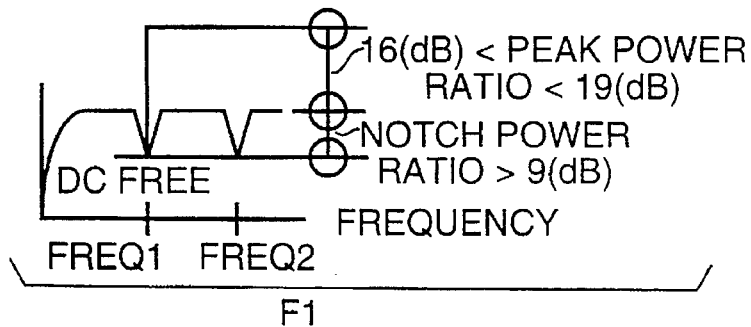
Figure 2D:
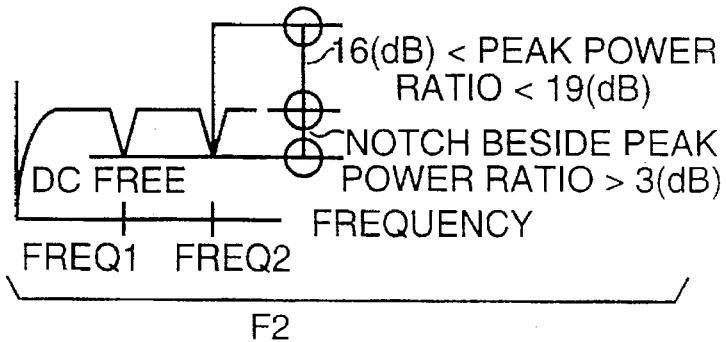
Figure 4:
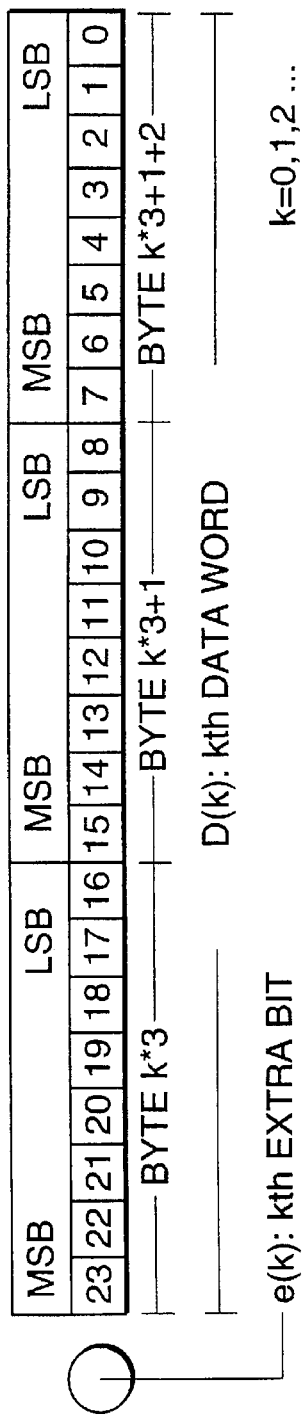
FIG. 4 shows the bit structure of a data-word processed in a 24/25 tone modulation standard.
Figure 5:
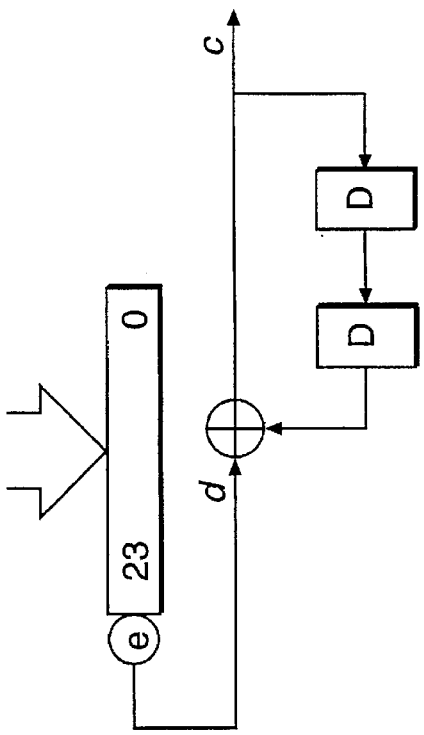
FIG. 5 is a functional block diagram showing a simplified encoding apparatus of the present invention.

FIG. 5 shows a simplified encoding apparatus 100 of the present invention. The encoding has a TMODE input port of two bits to select the encoding processes to be performed F0, F1 or F2 tracks. The encoding apparatus 100 further has an input port of twenty four bits to receive input words D(0), D(1), . . . , D(K), each having 24 bits. The encoding apparatus 100 then generates output words o(0), o(1), 0(2), . . . , o(n) where {o(n)=c(k,i)|n=25*k+24−i}. The complex computations of sine and cosine functions, the square and division operations and five layers of logic decision processes as required in the conventional SPNPM procedures are replaced by simplified operations. In order to provide more comprehensive description of the simplified encoding processes carried out by the apparatus 100 in FIG. 5, the steps taken to simplify the conventional SPNPM procedures are first explained in the following subsections.

A. Replace Sine and Cosine Functions by Simplified Operations:

A periodic function fT(n) with frequency of $\Omega$ wherein $\Omega=2\pi/T$ may be represented by a Fourier series as:

$$fT(n) = a_0 + \sum_{i=1}^{\infty} a_i \cos i\Omega n + \sum_{i=1}^{\infty} b_i \sin i\Omega n \quad (5)$$

Two periodic functions, i.e., fTr(n) and fTi(n), representing the real and imaginary parts of the above Fourier series are generated which can be defined as:

$$fTr(n) = \sum_{i=1}^{\infty} a_i \cos i\Omega n \quad fTi(n) = \sum_{i=1}^{\infty} b_i \sin i\Omega n \quad (6)$$

By substituting these two periodic functions for the sine and cosine functions in Equations 3-1 and 3-2, i.e., the real and imaginary parts of the encoded spectrum functions $sr_k$ and $si_k$ respectively, two approximation functions of $sr_k$ and $si_k$ are obtained which can be represented as:

$$sr_k' = sr_{k-1} + \sum_{i=24}^{0} C_{k,i} fTr(25k + 24 - i)\Omega \quad (7)$$

$$= sr_{k-1} + \sum_{i=24}^{0} C_{k,i} \cos(25k + 24 - i)\Omega +$$

$$\sum_{i=24}^{0} C_{k,i} \sum_{m=2}^{\infty} \cos m(25k + 24 - i)\Omega$$

$$= sr_k + dr_k$$

where $dr_k$ is the deviation of the approximating function $sr_k$ from $sr_k$ and:

$$dr_k = \sum_{i=24}^{0} C_{k,i} \sum_{m=2}^{\infty} \cos m(25k + 24 - i)\Omega$$

Similarly, for the imaginary part of the encoded spectrum function, an approximating function can be formulated as:

$$si_k' = si_{k-1} + \sum_{i=24}^{0} C_{k,i} fTi(25k + 24 - i)\Omega \quad (8)$$

$$= si_{k-1} + \sum_{i=24}^{0} C_{k,i} \sin(25k + 24 - i)\Omega +$$

$$\sum_{i=24}^{0} C_{k,i} \sum_{m=2}^{\infty} \sin m(25k + 24 - i)\Omega$$

$$= si_k + di_k$$

where $di_k$ is the deviation of the approximating function $si_k$ from $si_k$ and:

$$di_k = \sum_{i=24}^{0} C_{k,i} \sum_{m=2}^{\infty} \sin m(25k + 24 - i)\Omega$$

The deviations $dr_k$ and $di_k$ may be negligible when the high order terms of the Foueier series are very small.

In replacing fTr and fTi for the cosine and sine functions in Equations 3-1 and 3-2, the values of the approximating encoded functions $sr_k'$ and $si_k'$ can be obtained by the use of an integrated circuit (IC) which is greatly simplified compared to the sine and cosine functions as originally required. The values of $sr_k'$ and $si_k'$ can be obtained by using a four-bit dual polarities up-down counter. Since, the computations of $sr_k'$ and $si_k'$, as that shown in Equations (7) and (8), are simple summations of integers while the coefficients $C_{k,i}$ are values of either 1 or −1, the summing operations as that defined in Equations (7) and (8) can be carried out by changing the polarities of the up-down counter.

Figure 6:
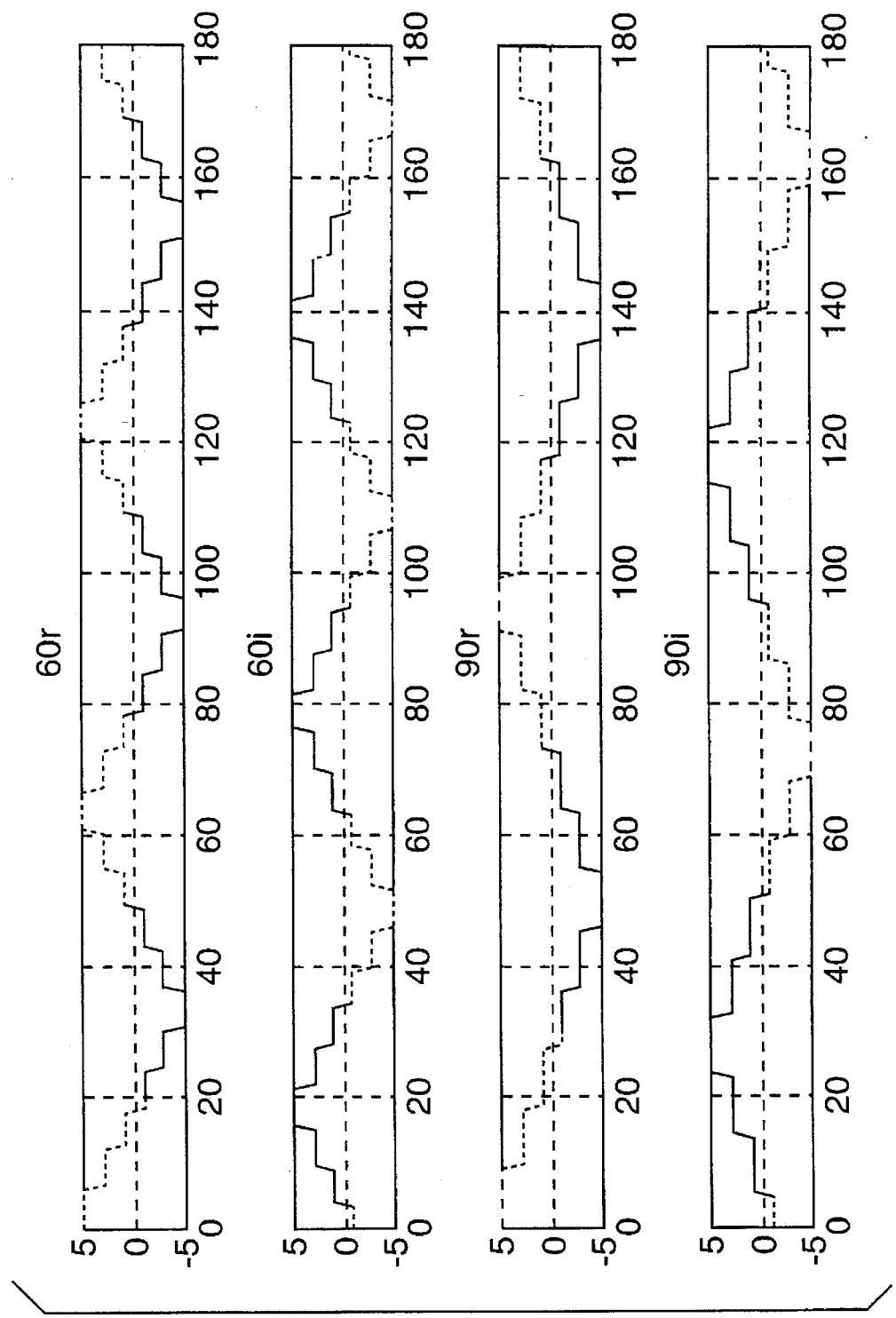
FIG. 6 shows the variations of simplified functions of 60r, 60i, 90r and 90i employed in the present invention.

Simplification in data processing can be appreciated from referring to FIG. 6 where the real and parts of the functions, i.e., fTr and fTi, are shown for two frequencies, i.e., fp/60 and fp/90, as 60r, 60i and 90r, 90i respectively, and as digitized step functions approximating the analog sine and cosine functions. A four bit dual polarities up-down counter can be applied to generate required output data. The more complex circuit for processing the numerical values of sine and cosine functions are now replaced with much simpler digital circuits. Furthermore, time savings are achieved because the time required to process the approximated values as that shown in FIG. 6 by the use of up-down counter is now much less than the sine and cosine function processes required in the prior art.

B. Replace Square Operations by Absolute Value Function

Referring to Equation (4) where the conventional SPNPM procedures require the calculations of power spectrum $p_k$ by performing a square on the work function $wr_k$ and $wri_k$, i.e., $pr_k=wr_k^2$ and $pi_k=wi_k^2$. It is noticed that $|wr_k|=\sqrt{ppr}$ and $|wi_k|=\sqrt{ppi}$. For the purpose of performing the 24/25 modulation encoding for ATF operation, the relative values of $pr_k$ and $pi_k$ are proportion to $|wr_k|$ and $|wi_k|$. For the determination of peaks and notches, the absolute values, i.e., $|wr_k|$ and $|wi_k|$, can be used as substitutes without actual calculation of the square values of $|wr_k|^2$ and $|wr_k|^2$. Thus the square calculations as employed in the convention SPNPM encoding processes can be simplified by substituting the square values with the absolute values.

C. Replace Division Operations by Estimator of Expectation Function

Referring to Equation (3) where the conventional SPNPM requires the calculations of $sr_k/25k$ and $si_k/25k$ to obtain the values of $wr_k$ and $wi_k$. In re-examining Equations 3-1 and 3-2, $wr_k$ and $wi_k$ can be treated as 'estimator of expectation' functions of the coefficients of the cosine and sine terms. An equivalent estimator can be defined as $$h_k = (1/25) \sum_{i=24}^{0} C_{k,i} \cos(25k + 24 - i)\Omega \qquad (10)$$

While the frequencies in monitoring the variations of the power spectrum are 60 Tb and 90 Tb, and the computations of the $h_k$ cover only 25 Tb, there may be great variances of $h_k$. The parameter $h_k$ is used together with a forgetting factor $\lambda$ to generate another estimator $H_k$.

$$H_k = (1-\lambda)(h_k + \lambda(h_{k-1} + \ldots + n\,\lambda(h_3 + \lambda(h_2 + \lambda(h_1 + \lambda h_0)))\ldots)) = (1-\lambda)(h_k + \lambda h_{k-1} + \lambda^2 h_{k-2} + \lambda^3 h_{k-3} + \ldots + \lambda^{k-2} h_2 + \lambda^{k-1} h_1 + \lambda^k h_0) \qquad (11)$$

where the forgetting factor $\lambda$ is a positive number less then 1.0. The closer $\lambda$ is to 1, the smaller is the value $H_k$. By defining two parameters $hr_k$ and $hi_k$ as:

$$hr_k = \sum_{i=24}^{0} C_{k,i} fTr(25k + 24 - i)\Omega \qquad (12\text{-}1)$$

and $$hi_k = \sum_{i=24}^{0} C_{k,i} fTi(25k + 24 - i)\Omega \qquad (12\text{-}2)$$

and by applying the forgetting factor $\lambda$, $Hr_k$ and $Hi_k$ are obtained as:

$$Hr_k = hr_k + \lambda Hr_{k-1} \quad Hi_k = hi_k + \lambda Hi_{k-1} \qquad (13)$$

In order to further simplify the calculations in Equation (13) such that only operations of integer are involved, $\lambda$ is defined defined as $(1-2^{-n})$. The value of $\lambda$ becomes closer to 1.0 as the value of n increases. Assuming that L is an integer and L can be derived from:

$$Y_n = Y_{n-1} + L \gg n, \text{ and } Y_0 = 0 \qquad (14)$$

where $L \gg n$ represets a bit-shifting operation of L to the right of n bits and this equation can be further developed as:

$$Y_n = \begin{cases} L(1-2^{-n}) - \sum_{i=0}^{n-1} Li(1-2^{-n+1}) L \geq 0 \\ \\ L(1-2^{-n}) - \sum_{i=0}^{n-1} \overline{Li}(1-2^{-n+1}) L < 0 \end{cases} \qquad (15)$$

where Li is the i-th bit of the integer L and $\overline{Li}$ is the inverse value of bit Li. The value of Yn can be approximated to be equivalent to $L(1-2^{-n})$ which is closer to a value of one when n is increased to exceed a certain large number. The multiplications of $Hr_{k-1}$ and $Hi_{k-1}$ as that required in Equation (13) can be approximated by $H'r_k$ and $H'i_k$ as:

$$H'r_k = hr_k + (1-2^{-n})H'r_{k-1} \quad H'i_k = hi_k + (1-2^{-n})H'i_{k-1} \qquad (13\text{-}1)$$

The estimations are thus replaced by simplified operations of right-shifting of bits and addition of integers. Additionally, the operations in generating a notch by obtaining a minimized value of $Hr_k + Hi_k$ when replaced by obtaining a minimum of $H'r_k + H'i_k$ generating a peak within the notch. This peak within notch provides a special feature which greatly simplifies the decision process by obtaining a minimum value of $(dcp + np + pp)$ because by detecting the peak within the notch, a comparator can easily determine the simultaneous occurrence of the notch.

D Applying Minimum Estimator Sum Strategy for Decision Logic

The decision logic for encoding the F0 track can be further simplified for improving the conventional SPNPM procedures. The logic decisions to be performed for the F0 track for either the DC power spectrum or the spectrum at freq1 and freq2 are to select a minimum value. Instead of applying a numerically controlled procedure as in the conventional SPNPM scheme to minimize the values for the F0 track, the present invention employs the linear characteristics of the power spectrum and makes us of variations of the power spectrum. A typical decision making logic can be represented by the following program written in commonly used C-language:

if $((dcp_k|_0 + np_k|_0{}^1 + np_k|_0{}^2) < (dcp_k|_1 + np_k|_1{}^1 + np_k|_1{}^2))$ then
   $e_k = 0;$
else
   $e_k = 1;$ Weighting factors can be applied to the DC terms of the power spectrum to adjust the distribution and enhance the decision making process as shown in the following example:

if $((8dcp_k|_0 + np_k|_0{}^1 + np_k|_0{}^2) < (8dcp_k|_1 + np_k|_1{}^1 + np_k|_1{}^2))$ then
   $e_k = 0;$
else
   $e_k = 1;$ By the use of this estimation of variation method, the decision making logic has the advantage that the logic is based on comparisons of relative values instead of actual performance of the calculation of the real values before the comparisons are made. The division process of $1/25$ K as that required in the conventional SPNPM procedures is eliminated. The decision logic is greatly simplified by taking advantage of the nature of the minimum value requirement of the F0 track for the power spectrum.

Figure 7:
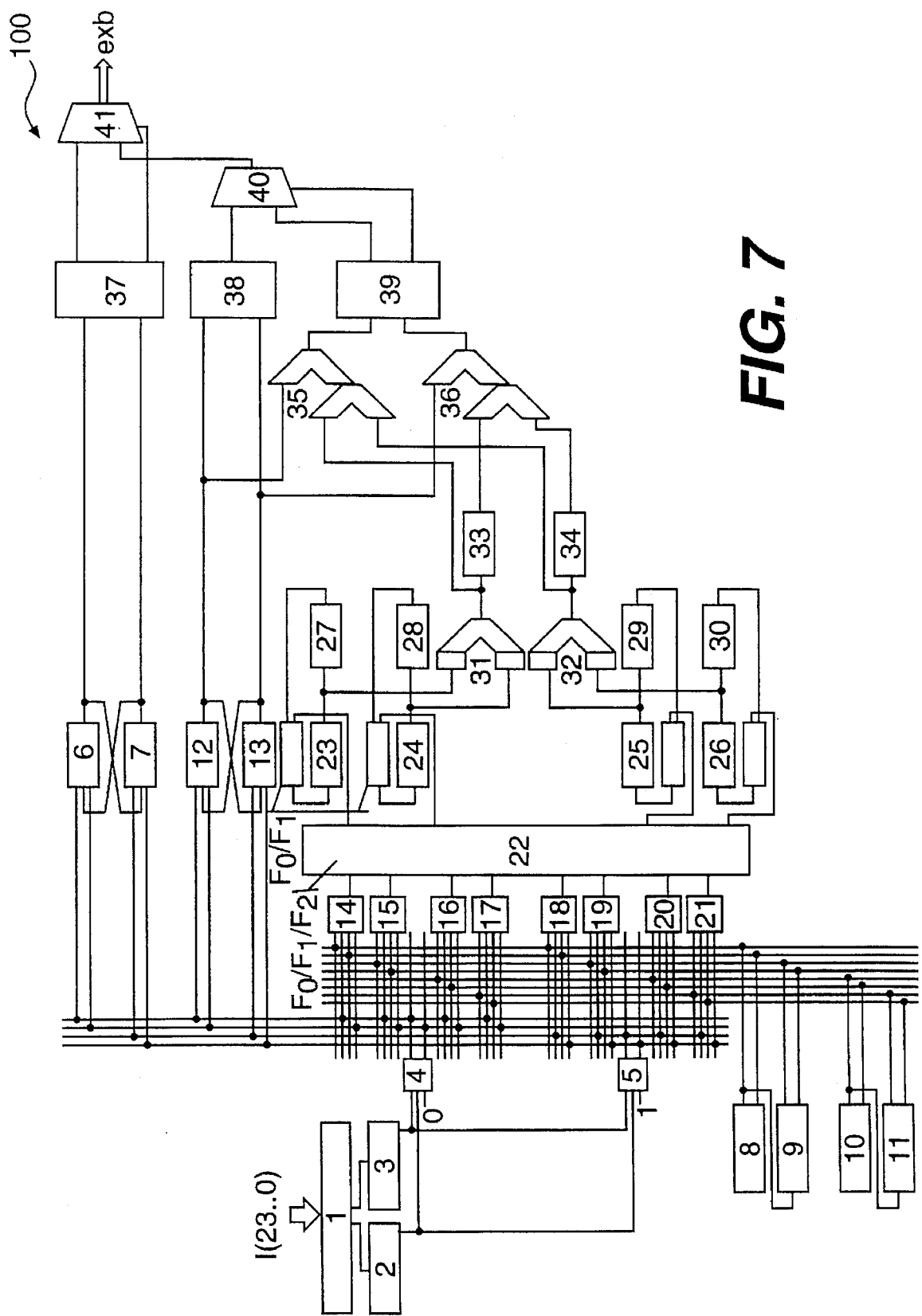
FIG. 7 is an overall functional blocks showing a simplified encoding apparatus of the present invention.

FIG. 7 shows the block diagram of an encoding apparatus 100 which implements the above simplifications to reduce the gate count of the encoder in applying the 24/25 modulation encoding based on video tape ATF standard. The block 1 is a 24-bit data latch for receiving an input word D(k). The blocks f2 and f3 are 12-bit data rotating latches for receiving the odd and even bits of D(k) respectively from the latch 1. The blocks 4 and 5 are two-bit encoders to perform the INRZ encoding as described in Equation (1) for generating two 25-bit words based on the 24/25 modulation encoding standard where 1 is for $e_k = 0$ and 5 is for $e_k = 1$. The blocks 6 and 7 are run-length counters for counting the run-length-0 and run-length-1 for subsequent determination of the value of either zero or one to be assigned to the 25th-bit. The blocks 12 and 13 compute the first and the second DC components of two words generated by blocks 4 and 5 after adding a 25th-bit of zero and one to D(K).

Figure 8A:
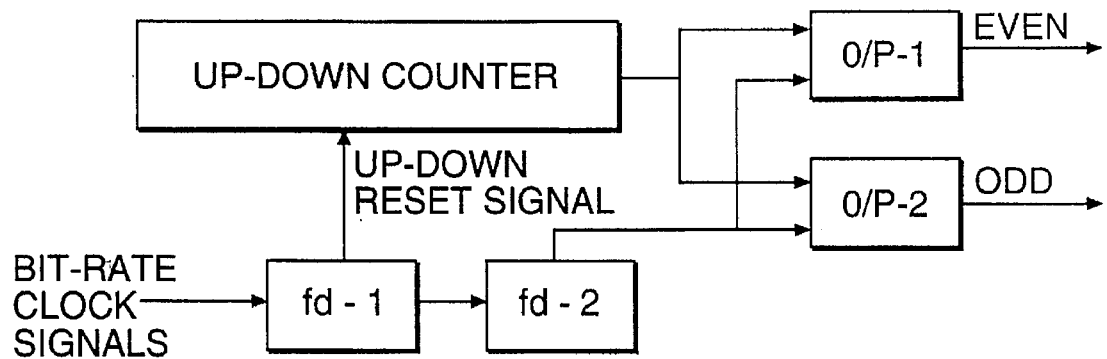
FIG. 8A shows a functional diagram of blocks 8 and 10.
Figure 8B:
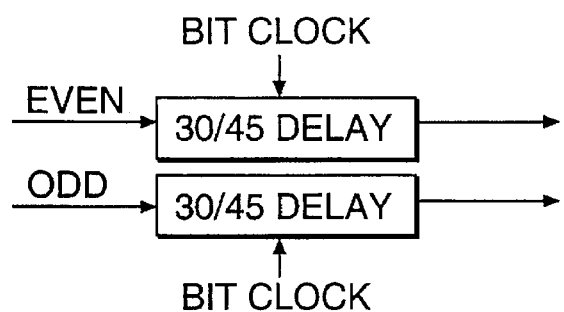
FIG. 8B shows a functional diagram of blocks 9 and 11.

The blocks 8 to block 11 computes 60r 60i, 90r, and 90i according to equation (6) as that shown in FIG. 6. FIG. 8A shows a functional block diagram for illustrating the functions performed in each of the blocks 8 and 10. For the purpose of generating an approximated sine functions as shown in FIG. 6, a frequency divider fd–1 is used which receives input clock signals which are bit-rate frequency signals. The input bit-rate frequency signals are divided by either 30 or 45, i.e., counting 1, every 30 or 45 cycles respectively. The frequency divider fd–1 then outputs a reset signal to an updown counter to start counting up or down. For the purpose of outputting for the even and the odd bits, each of the function blocks 8 to 11 further includes a second frequency divider fd–2 to divide the output frequency by two for alternating the output for the even bits and odd bits through the even and odd output lines. By the use of the up-down counter, functions 60r 60i, 90r, and 90i as shown in FIG. 6 are obtained. FIG. 8A shows the functions performed by the functional blocks of 9 and 11. Each of the functional blocks 9 and 11 includes a ninety-degree phase delay circuit as the real and imaginary parts have a ninety degrees phase difference wherein 9 and 11 each includes a delay circuit which receives a clock signal and process the delay for both the even and the odd bits.

The invention thus teaches a 24/25 modulation encoding device for generating a power spectrum of a binary sequence using spectrum peak and notch power monitoring (SPNPM) modulation. The encoding device includes a dual polarity up-down counter for generating digitized step functions for replacing a sine and a cosine functions required by the SPNPM modulation for reducing circuit complexity of the encoding device.

Figure 9:
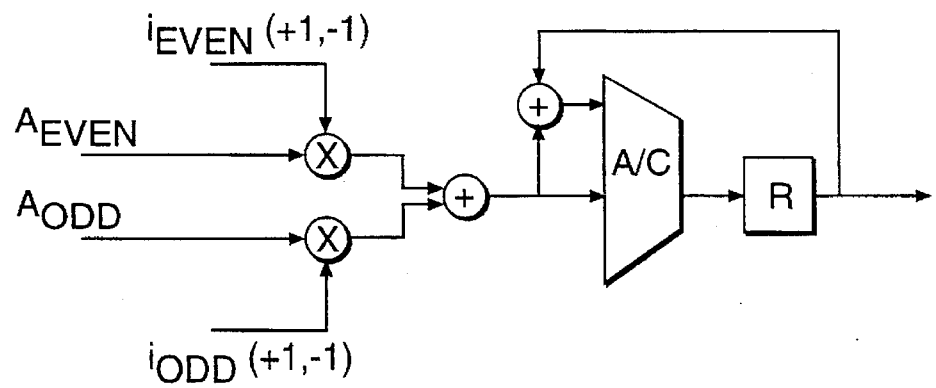
FIG. 9 shows the logic block diagram of a processor for circuit implementation of functional blocks disclosed in FIG. 7.

Functional blocks 14 to 21 are 8-bit accumulators for generating:

1) O14: $hr_{kT=60}$ when $e_k=0$
2) O15: $hi_{kT=60}$ when $e_k=0$
3) O16: $hr_{kT=90}$ when $e_k=0$
4) O17: $hi_{kT=90}$ when $e_k=0$
5) O18: $hr_{kT=60}$ when $e_k=1$
6) O19: $hi_{kT=60}$ when $e_k=1$
7) O20: $hr_{kT=90}$ when $e_k=1$
8) O21: $hi_{kT=90}$ when $e_k=1$ according Equations (12-1) and (12-2). FIG. 9 shows more details of the operational functions performed by each of these blocks. The even and odd inputs are summed up and inputted to an accumulate/load (A/L) unit which accumulates the data received. Depending on the status of a reset unit R, the output of the A/L unit either is looped back for further accumulation or outputted to block 22 as described below. As shown in FIG. 7, blocks 14 to 17 are for processing the accumulation of input for $e_k=0$ and the blocks 18 to 22 are for processing the accumulation of input for $e_k=1$.

Figure 10A:
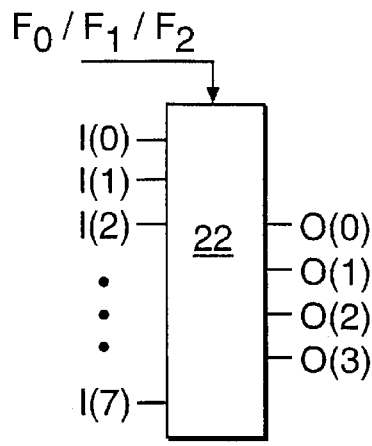
FIG. 10A to 10C are logic block diagrams showing the circuit implementations of functional blocks disclosed in FIG. 7.
Figure 10B:
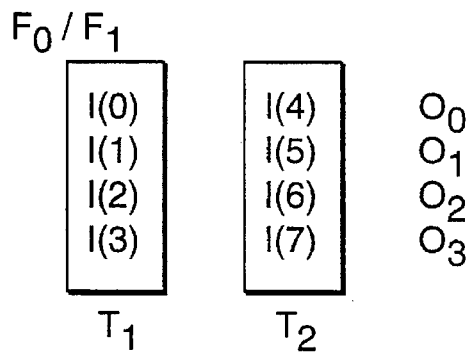
Figure 10C:
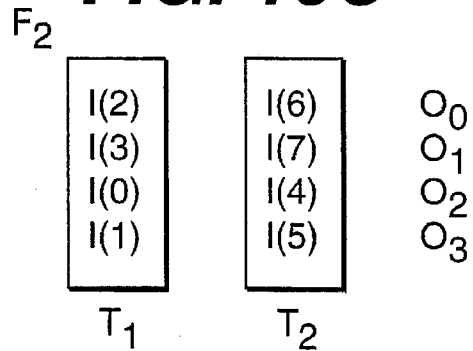

Functional block 22 is a time and path multiplexer which receives a mode selection input for selecting a mode of F0/F1/F2. According the mode selection, the time and path multiplexer then direct the output O14 to O21 generated from blocks 14 to 21 at different times in different paths for peak and notch processes. FIGS. 10A to 10C provide the operational logics of the functional block 22. As shown in FIG. 10A, the block 22 receives eight input signals, i.e., I(0) to I(7), and generates four output signals, i.e., O(0) to O(3). As shown in FIGS. 10B and 10C, when the mode F0/F1 is selected, in a first time period, T1, the four output lines are connected to I(0) to I(3), and at a next time period T2, the four output lines are connected to I(4) to I(7). When the mode F2 is selected, in a first time period, T1, the four output lines are connected to I(2), I(3), I(0) and I(1) respectively, and at a next time period T2, the four output lines are connected to I(6), I(7), I(4) and I(5) respectively.

The functional blocks 23 and 24 are 9-bit special function accumulators for performing different types of accumulation operations depending on the selected modes of F0/F1/F2. When F1/F2 modes are selected, a peak power spectrum based on Equation 13 is processed, i.e., block 23 is employed to process $Hr_k$ and block 24 is to process $Hi_k$ by:

$$O(n) = I + \sum_{i=1}^{7} O(n-1) \gg i$$

Figure 11A:
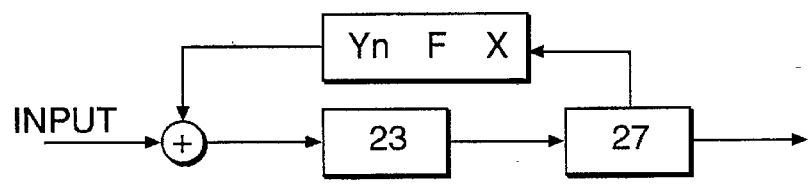
FIG. 11A to 11C are logic block diagrams showing the circuit implementations of functional blocks disclosed in FIG. 7.
Figure 11B:
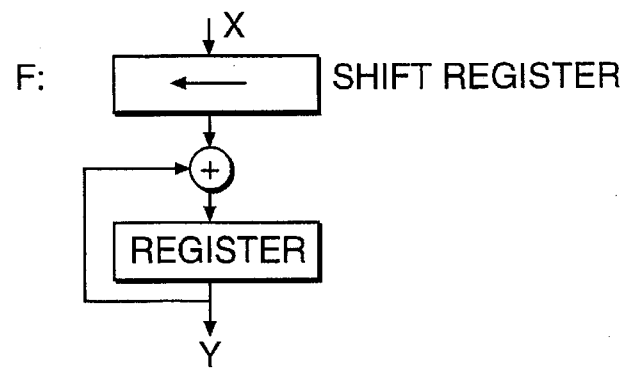

When a F0 mode is selected, the power spectrum of notch is estimated based on Equations (7) and (8) where the block 23 is used to process $sr'_k$ and $si'_k$ where accumulation operation of $O(n)=I+O(n-1)$ is performed. Referring to FIG. 11A for the sequence of operations of 23 and 27 which are used to generate Hrk wherein 23 processes a value for $Hrkle_k=0$ at every k-th time period while 27 processes a value of $Hrkle_k=1$ at every k-th time period. Since the input data are received from 22, the values of the input are alternated between $h_{rk}le_k=0$ and $h_{rk}le_k=1$ and the values processed by 23 and 27 are also alternated in the accumulation operations. The operations performed by 23 and 27 are different from that of 25 and 29. The blocks 23 and 27 perform an approximation operation by applying forgetting factor, i.e., $\lambda Hr'_{k-1}$, which transform the operations for generating Hrk into a bit-shifting operation as that shown in FIG. 11B wherein a shift register is used to apply bit shifting process and then accumulations are carried out. Similarly, blocks 24 and 28 are employed to process $Hikle_k=0$ and $Hikle_k=1$.

Figure 11C:
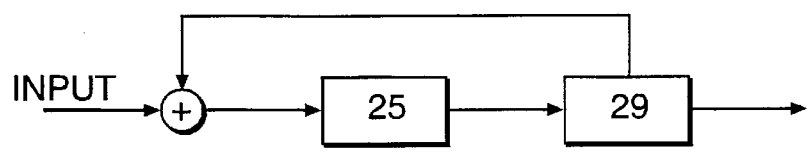

The functional blocks 25 and 26 are 9-bit accumulators for processing the estimation of notch powers according to Equations (7) and (8) where accumulation of $O(n)=I+O(n-1)$ is performed. The output generated from the blocks 23 to 26 are received by functional blocks 27 to 30 which are 9-bit latches for sequentially storing the estimation when $e_k=0$. Specifically, blocks 27 to 30 are employed to store $Hr_kle_k=0$, $Hi_kle_k=0$, $sr'_kle_k=0$, and $si'_kle_k=0$ respectively, when F1 or F2 modes are selected. When F0 mode is selected, blocks 27 to 30 are employed to store $sr'_k$lfp=freq1, $e_k=0$, $si'_k$lfp=freq1, $e_k=0$, $sr'_k$lfp=freq2, $e_k=0$, and $si'_k$lfp=freq2, $e_k=0$, when F1 or F2 modes are selected. Referring to FIG. 11C for the sequence of operations of 25 and 29 which are used to generate $sr'_k$ wherein 25 processes a value for $sr'_kle_k=0$ at every k-th time period while 29 processes a value of $sr'_kle_k=1$ at every k-th time period. Since the input data is received from 22, the values of the input received are:

$$\sum_{i=24}^{0} C_k f Tr(25k+24-i)le_k = 0 \text{ and } le_k = 1$$

respectively depending the time period T1 and T2. The functional blocks 25 and 29 also alternate between T1 and T2 to accumulate the input values received. Similarly, the functional blocks 26 and 30 are applied to process $si'_kle_k=0$ at every k-th time period while 29 processes a value of $si'_kle_k=1$.

The invention thus teaches a 24/25 modulation encoding device for generating a power spectrum of a binary sequence using spectrum peak and notch power monitoring (SPNPM) modulation. The encoding device includes a bit shifter and an accumulator for generating an estimator of expectation for approximating a real and an imaginary part of a work value for obtaining a power spectrum required by the SPNPM modulation whereby the encoding device is simplified.

Functional blocks 31 and 32 are absolute value accumulators for receiving the real and imaginary parts from blocks 23, 24, 25 and 26 and perform an accumulation of O=|I1|+

|I2|. When the F1 or F2 modes are selected, functional blocks 33 and 34 are used to perform accumulations of $|Hr_k|+|Hi_k|e_k=0$ and $|sr'_k|+|si'_k|e_k=0$. When F0 mode is selected, functional blocks 33 and 34 are used to perform accumulations of $|sr'_k|+|si_k|$fp=freq1 $e_k=0$ and $|sr'_k|+|si'_k|51$ freq2, $e_k=0$. The accumulated sums of the absolute values are then outputted to the functional blocks 33 and 34 which are two data latches for sequentially and temporarily storing these data for one clock cycle.

The invention thus teaches a 24/25 modulation encoding device for generating a power spectrum of a binary sequence using spectrum peak and notch power monitoring (SPNPM) modulation. The encoding device includes an absolute accumulator for receiving the estimator of expectation approximating the real and imaginary parts of the work value for generating an absolute work value to replace a work-square value required for generating a power spectrum thus simplifying the encoding device.

Figure 12:
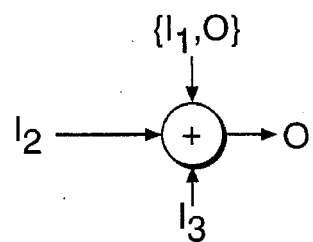
FIG. 12 is a logic block diagram showing the circuit implementations of functional blocks disclosed in FIG. 7.

The functional blocks 35 and 36 receive the DC components from the blocks f12 and f13 and the estimated power spectrum from blocks 33 and 34 at freq1 and freq2 for processing the linear sum wherein an operation of (2*I1+I2+I3) is performed. The block 35 processes the power spectrum estimator of the linear sum for $e_k=0$ and the block 36 for $e_k=1$. Referring to FIG. 12 where a logic diagram is shown to implement the operation of (2*I1+I2+I3) to be performed in blocks 35 and 36.

The output data from the blocks 6 and 7 are inputted to functional block 37 which is a 4-bit comparator for generating two output, i.e., O1=(I1>I2) and O2=(I1>9) or (I2>9). The functional blocks 38 is a 7-bit comparator which receives input data from blocks 12 and 13 for generating an output, i.e., O1=($l_1$>$l_2$|). The output from the block 35 and 36 are received by the block 39 which is a 11=bit comparator for generating two output data, i.e., O1=(I1>I2) and O2=(I1≠I2). Finally, the functional blocks 40 and 41 are 2/1 multiplexers for receiving output data generated from blocks 37 to 39 and output O which is defined as:

if *I3* then
   O = *I1*
else
   O = *I2*

The invention thus teaches a 24/25 modulation encoding device for generating a power spectrum of a binary sequence using spectrum peak and notch power monitoring (SPNPM) modulation. The encoding device includes a linear sum circuit with an input terminal designated as a DC terminal looping back for extra-weighting an input therefrom. The encoding device further includes a comparator following the linear sum circuit for determining a smaller sum value for monitoring a notch required by the SPNPM modulation for reducing circuit complexity of the encoding device.

Therefore, the present invention provides an encoding apparatus with reduced gate count by implementing a simplified encoding technique such that the difficulties and limitations encountered in the prior art are resolved. Specifically, in the encoding apparatus of the present invention the sine and cosine operations required to be performed by a conventional encoder are replaced with simplified integer operations. The square operations which are required in a conventional encoder are now replaced with simplified absolute value operations. Furthermore, the division operations of a conventional encoder are replaced with simplified estimation of expectation value operations. The multiple layer of decision logic operations required to be performed by a conventional encoder are replaced with simplified minimum estimator sum strategy (MESS) operations.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A 24/25 modulation encoding device for generating a power spectrum of a binary sequence using spectrum peak and notch power monitoring (SPNPM) modulation, comprising:

means for generating digitized step functions for replacing sine and cosine functions required by said SPNPM modulation for reducing circuit complexity of said encoding device.

2. The 24/25 modulation encoding device of claim 1 further comprising:

a bit shifter and an accumulator for generating an estimator of expectation for approximating a real and an imaginary part of a work value for obtaining said power spectrum required by said SPNPM modulation whereby said encoding device is simplified.

3. The 24/25 modulation encoding device of claim 2 further comprising:

an absolute accumulator for receiving said estimator of expectation approximating said real and imaginary parts of said work value and for generating an absolute work value to replace a work-square value required for generating said power spectrum thus simplifying said encoding device.

4. The 24/25 modulation encoding device of claim 3 further comprising:

a linear sum circuit with an input terminal designated as a DC terminal looping back for extra-weighting an input therefrom; and a comparator coupled to said linear sum circuit for determining a smaller sum value for monitoring a notch required by said SPNPM modulation for reducing circuit complexity of said encoding device.

5. A 24/25 modulation encoding device for generating a power spectrum of a binary sequence using spectrum peak and notch power monitoring (SPNPM) modulation, comprising:

means for generating digitized step functions for replacing sine and cosine functions required by said SPNPM modulation;

a bit shifter and an accumulator for generating an estimator of expectation for approximating a real and an imaginary part of a work value for obtaining said power spectrum required by said SPNPM modulation;

an absolute accumulator for receiving said estimator of expectation approximating said real and imaginary parts of said work value and for generating an absolute work value to replace a work-square value required for generating said power spectrum;

a linear sum circuit with an input terminal designated as a DC terminal looping back for extra-weighting an input therefrom; and a comparator coupled to said linear sum circuit for determining a smaller sum value for monitoring a notch required by said SPNPM modulation for reducing circuit complexity of said encoding device.

6. A method for performing 24/25 modulation encoding by generating a power spectrum of a binary sequence using spectrum peak and notch power monitoring (SPNPM) modulation, comprising a step of:

generating digitized step functions for replacing sine and cosine functions required by said SPNPM modulation for simplifying said encoding method.

7. The method of performing a 24/25 modulation encoding of claim 6 further comprising a step of:

employing a bit shifter and an accumulator for generating an estimator of expectation for approximating a real and an imaginary part of a work value for obtaining said power spectrum required by said SPNPM modulation for simplifying said encoding method.

8. The method of performing a 24/25 modulation encoding of claim 7 further comprising a step of:

employing an absolute accumulator for receiving said estimator of expectation approximating said real and imaginary parts of said work value and for generating an absolute work value to replace a work-square value required for generating said power spectrum thus simplifying said encoding method.

9. The method of performing a 24/25 modulation encoding of claim 8 further comprising a step of:

employing a linear sum circuit with an input terminal designated as a DC terminal looping back for extra-weighting an input therefrom; and employing a comparator coupled to said linear sum circuit for determining a smaller sum value for monitoring a notch required by said SPNPM modulation for simplifying said encoding method.

10. A method for performing 24/25 modulation encoding by generating a power spectrum of a binary sequence using spectrum peak and notch power monitoring (SPNPM) modulation, comprising the steps of:

generating digitized step functions for replacing sine and cosine functions required by said SPNPM modulation;

employing a bit shifter and an accumulator for generating an estimator of expectation for approximating a real and an imaginary part of a work value for obtaining said power spectrum required by said SPNPM modulation;

employing an absolute accumulator for receiving said estimator of expectation approximating said real and imaginary parts of said work value and for generating an absolute work value to replace a work-square value required for generating said power spectrum;

employing a linear sum circuit with an input terminal designated as a DC terminal looping back for extra-weighting an input therefrom; and employing a comparator coupled to said linear sum circuit for determining a small sum value for monitoring a notch required by said SPNPM modulation for simplifying said encoding method.

\* \* \* \* \*